United States Patent
Cao et al.

(10) Patent No.: US 9,704,437 B2
(45) Date of Patent: Jul. 11, 2017

(54) GATE DRIVING CIRCUIT, ARRAY SUBSTRATE, AND DISPLAY DEVICE

(71) Applicant: Shenzhen China Star Optoelectronics Technology Co., Ltd., Shenzhen, Guangdong (CN)

(72) Inventors: Shangcao Cao, Guangdong (CN); Chao Dai, Guangdong (CN); Chang Yeh Lee, Guangdong (CN)

(73) Assignee: Shenzhen China Star Optoelectronics Technology, Co., Ltd., Shenzhen, Guangdong (CN)

( * ) Notice: Subject to any disclaimer, the term of this patent is extended or adjusted under 35 U.S.C. 154(b) by 0 days.

(21) Appl. No.: 14/418,598

(22) PCT Filed: Jan. 21, 2015

(86) PCT No.: PCT/CN2015/071245
§ 371 (c)(1),
(2) Date: May 9, 2016

(87) PCT Pub. No.: WO2016/095321
PCT Pub. Date: Jun. 23, 2016

(65) Prior Publication Data
US 2016/0247455 A1    Aug. 25, 2016

(30) Foreign Application Priority Data
Dec. 18, 2014    (CN) .......................... 2014 1 0797938

(51) Int. Cl.
G09G 3/3266    (2016.01)
G09G 3/36      (2006.01)
G11C 19/28     (2006.01)

(52) U.S. Cl.
CPC ......... G09G 3/3266 (2013.01); G09G 3/3677 (2013.01); G11C 19/287 (2013.01);
(Continued)

(58) Field of Classification Search
CPC ....... G09G 2300/0408; G09G 2230/00; G09G 3/3666; G09G 2310/0286;
(Continued)

(56) References Cited

U.S. PATENT DOCUMENTS

2016/0260398 A1* 9/2016 Yao ...................... G09G 3/3648

FOREIGN PATENT DOCUMENTS

CN    101976580 A    2/2011
CN    102184719 A    9/2011
(Continued)

OTHER PUBLICATIONS

International Search Report and Written Opinion, Jan. 21, 2015, China.

*Primary Examiner* — Alexander Eisen
*Assistant Examiner* — Abhishek Sarma
(74) *Attorney, Agent, or Firm* — Kim Winston LLP (57) ABSTRACT

A gate driving circuit, an array substrate, and a display device are disclosed. The present disclosure relates to the technical field of display, and the technical problem of poor quality of the waveform of the gate driving signal that is output by the traditional circuit manufactured through GOA technology can be solved. The gate driving circuit is used for outputting the gate driving signal to $G_n$ and comprises a pull-up circuit, a download transistor, and a pull-down circuit. The pull-up circuit is used for outputting a high-level signal to a reference point of said gate driving circuit, a first input end of said pull-up circuit is connected with $G_{n-1}$, a second input end thereof is connected with $G_{n-2}$, and an output end thereof is connected with said reference point.

14 Claims, 4 Drawing Sheets

(52) U.S. Cl.
CPC ....... *G09G 3/3666* (2013.01); *G09G 2230/00* (2013.01); *G09G 2300/0408* (2013.01); *G09G 2300/0809* (2013.01); *G09G 2310/0202* (2013.01); *G09G 2310/0283* (2013.01); *G09G 2310/0286* (2013.01)

(58) Field of Classification Search
CPC ... G09G 2310/0283; G09G 2300/0809; G09G 3/3677; G09G 3/3266; G09G 2310/0202; G11C 19/28
See application file for complete search history.

(56) References Cited

FOREIGN PATENT DOCUMENTS

| CN | 103646636 A | 3/2014 |
|---|---|---|
| CN | 103700355 A | 4/2014 |
| CN | 103928007 A | 7/2014 |
| CN | 103985369 A | 8/2014 |
| EP | 1445862 A2 | 8/2004 |

\* cited by examiner

GATE DRIVING CIRCUIT, ARRAY SUBSTRATE, AND DISPLAY DEVICE

CROSS REFERENCE TO RELATED APPLICATION

The present application claims benefit of Chinese patent application CN 201410797938.0, entitled "Gate Driving Circuit, Array Substrate, and Display Device" and filed on Dec. 18, 2014, which is incorporated herein by reference.

FIELD OF THE INVENTION

The present disclosure relates to the technical field of display, and particularly to a gate driving circuit, an array substrate, and a display device.

BACKGROUND OF THE INVENTION

At present, in liquid crystal display devices and Organic Light-Emitting Diode (OLED) display devices, it is quite common that each pixel unit is driven by a Thin Film Transistor (TFT).

A gate driving circuit which is used for driving the TFT can be made on an array substrate through Gate Driver on Array (GOA) technology, in order to substitute an original external integrated circuit. In this manner, the welding procedure of the external integrated circuit can be saved, the production efficiency thereof can be improved, and the production cost thereof can be reduced. Moreover, the display products can be produced with narrow frame, or even without frame.

However, the quality of the waveform of the gate driving signal that is output by the traditional GOA circuit is poor, and therefore, the quality of the image displayed by the display device is poor as well.

SUMMARY OF THE INVENTION

The present disclosure aims to provide a gate driving circuit, an array substrate, and a display device, in order to solve the technical problem of poor quality of the waveform of the gate driving signal that is output by the traditional GOA circuit.

The present disclosure provides a gate driving circuit, used for outputting a gate driving signal to an $n^{th}$ scanning line, said gate driving circuit comprising a pull-up circuit, a download transistor, and a pull-down circuit, wherein said pull-up circuit is used for outputting a high-level signal to a reference point of said gate driving circuit, said pull-up circuit having a first input end connected with an $(n-1)^{th}$ scanning line, a second input end connected with an $(n-2)^{th}$ scanning line, and an output end connected with said reference point;

wherein said download transistor has a gate connected with said reference point, a source connected with a clock signal line, and a drain connected with the $n^{th}$ scanning line, the drain of said download transistor outputting the high-level signal to the $n^{th}$ scanning line when said reference point and said clock signal line both have the high-level signal; and wherein said pull-down circuit is used for outputting a low-level signal to said reference point and the $n^{th}$ scanning line, said pull-down circuit having a first input end connected with an $(n+1)^{th}$ scanning line, and an output end connected with said reference point.

The gate driving circuit further comprises a coupling capacitor that is connected between said reference point and the $n^{th}$ scanning line.

Preferably, said pull-up circuit comprises a first transistor and a second transistor;

wherein a gate of said first transistor is connected with the $(n-1)^{th}$ scanning line, a source thereof is connected with a first signal line, and a drain thereof is connected with said reference point; and wherein a gate of said second transistor is connected with the $(n-2)^{th}$ scanning line, a source thereof is connected with the first signal line, and a drain thereof is connected with said reference point.

Further, the pull-down circuit is provided with a second input end that is connected with an $(n+2)^{th}$ scanning line.

Preferably, the pull-down circuit comprises a third transistor and a fourth transistor;

wherein a gate of said third transistor is connected with the $(n+1)^{th}$ scanning line, a source thereof is connected with a second signal line, and a drain thereof is connected with said reference point; and wherein a gate of said fourth transistor is connected with the $(n+2)^{th}$ scanning line, a source thereof is connected with the second signal line, and a drain thereof is connected with said reference point.

Preferably, during a forward scanning stage, said first signal line outputs a high-level signal, and said second signal line outputs a low-level signal; and during a backward scanning stage, said first signal line outputs a low-level signal, and said second signal line outputs a high-level signal.

The gate driving circuit further comprises a first pull-down sustaining circuit and a second pull-down sustaining circuit, wherein during a forward scanning stage, said first pull-down sustaining circuit is used for sustaining the low-level signal of said reference point and the $n^{th}$ scanning line; and wherein during a backward scanning stage, said second pull-down sustaining circuit is used for sustaining the low-level signal of said reference point and the $n^{th}$ scanning line.

The present disclosure further provides an array substrate, comprising a plurality of gate driving circuits that are cascade-connected, each of said gate driving circuits being used for outputting a gate driving signal to a scanning line.

Further, in four adjacent gate driving circuits, the sources of the download transistors thereof are connected with four clock signal lines respectively, and the four clock signal lines output high-level signals in sequence.

The present disclosure further provides a display device, and the display device comprises the array substrate.

The following beneficial effects can be brought about by the present disclosure. In the gate driving circuit according to the present disclosure, the pull-up circuit comprises the first input end and the second input end, which are connected with the $(n-1)^{th}$ scanning line and the $(n-2)^{th}$ scanning line respectively. When the $(n-2)^{th}$ scanning line outputs the gate driving signal, the reference point (i.e., the gate of the download transistor) is charged for a first time by the pull-up circuit; and when the $(n-1)^{th}$ scanning line outputs the gate driving signal, the reference point is charged for a second time by the pull-up circuit.

The reference point can reach a higher electric potential since it is charged twice. When the clock signal line has the high-level signal, and the drain of the download transistor outputs the gate driving signal, an electric potential difference Vgs between the gate and the source of the download transistor can be improved significantly. In this case, an output impedance of the download transistor can be reduced, the waveform of the gate driving signal that is output to the $n^{th}$ scanning line can be optimized, and thus the display effect of the display device can be improved.

Other features and advantages of the present disclosure will be further explained in the following description, and partially become self-evident therefrom, or be understood through the embodiments of the present disclosure. The objectives and advantages of the present disclosure will be achieved through the structure specifically pointed out in the description, claims, and the accompanying drawings.

BRIEF DESCRIPTION OF THE DRAWINGS

The drawings necessary for explaining the embodiments are introduced briefly below to illustrate the technical solutions of the embodiments of the present disclosure more clearly.

DETAILED DESCRIPTION OF THE EMBODIMENTS

The present disclosure will be explained in details with reference to the embodiments and the accompanying drawings, whereby it can be fully understood how to solve the technical problem by the technical means according to the present disclosure and achieve the technical effects thereof, and thus the technical solution according to the present disclosure can be implemented. It should be noted that, as long as there is no structural conflict, all the technical features mentioned in all the embodiments may be combined together in any manner, and the technical solutions obtained in this manner all fall within the scope of the present disclosure.

Figure 1:
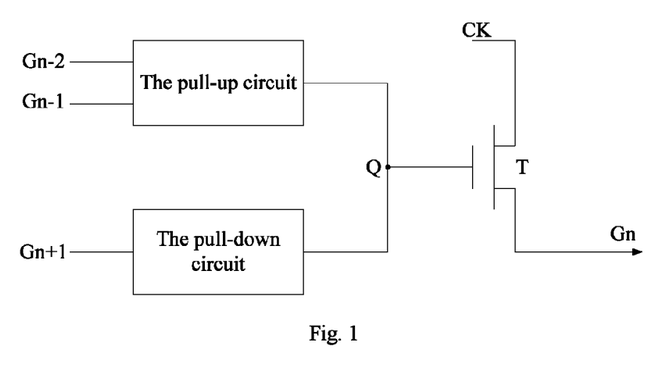
FIG. 1 schematically shows a gate driving circuit according to an embodiment of the present disclosure.

As shown in FIG. 1, the embodiment of the present disclosure provides a gate driving circuit, which is used for outputting a gate driving signal to an $n^{th}$ scanning line $G_n$. The gate driving circuit comprises a pull-up circuit, a download transistor, and a pull-down circuit.

The pull-up circuit is used for outputting a high-level signal to a reference point Q of the gate driving circuit. A first input end of the pull-up circuit is connected with an $(n-1)^{th}$ scanning line $G_{n-1}$, a second input end thereof is connected with an $(n-2)^{th}$ scanning line $G_{n-2}$, and an output end thereof is connected with the reference point Q.

A gate of the download transistor T is connected with Q, a source thereof is connected with a clock signal line CK, and a drain thereof is connected with $G_n$. The drain of the download transistor T will output the high-level signal (i.e., the gate driving signal) to $G_n$ when Q and CK both have the high-level signal.

The pull-down circuit is used for, after $G_n$ outputs the gate driving signal, outputting a low-level signal to Q and $G_n$. A first input end of the pull-down circuit is connected with an $(n+1)^{th}$ scanning line $G_{n+1}$, and an output end thereof is connected with Q.

In the gate driving circuit according to the embodiment of the present disclosure, the pull-up circuit comprises the first input end and the second input end, which are connected with $G_{n-1}$ and $G_{n-2}$ respectively. When $G_{n-2}$ outputs the gate driving signal, the reference point Q (i.e., the gate of the download transistor T) is charged for a first time by the pull-up circuit; and when $G_{n-1}$ outputs the gate driving signal, the reference point Q is charged for a second time by the pull-up circuit.

The reference point Q can reach a higher electric potential since it is charged twice. When the clock signal line CK has the high-level signal, and the drain of the download transistor T outputs the gate driving signal, an electric potential difference Vgs between the gate and the source of the download transistor T can be improved significantly. In this case, an output impedance of the download transistor T can be reduced, so that the waveform of the gate driving signal that is output to $G_n$ can be optimized, and thus the display effect of the display device can be improved.

Embodiment 1

The present embodiment provides a gate driving circuit, which is preferably manufactured through GOA technology. The gate driving circuit comprises a pull-up circuit, a download transistor, and a pull-down circuit.

Figure 2:
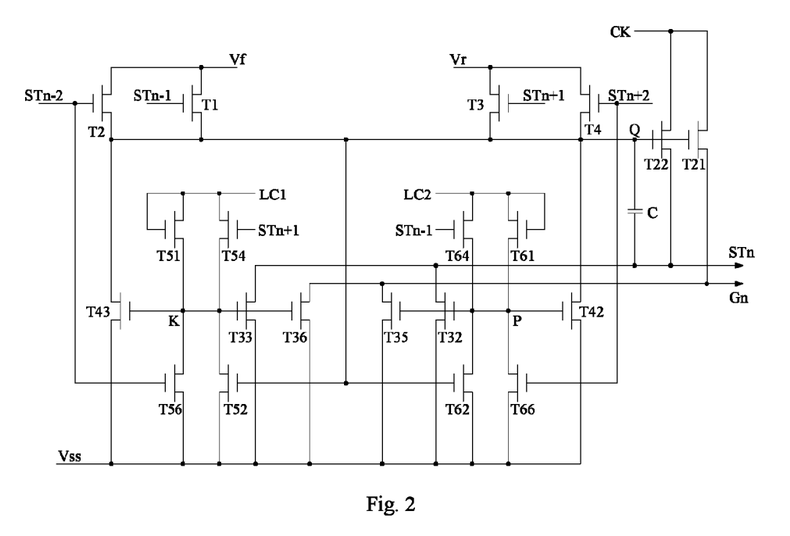
FIG. 2 is a circuit diagram of a gate driving circuit according to Embodiment 1 of the present disclosure.

As shown in FIG. 2, the pull-up circuit comprises a first transistor T1 and a second transistor T2. A gate of T1 is connected with $ST_{n-1}$, a source thereof is connected with a first signal line Vf, and a drain thereof is connected with Q. A gate of T2 is connected with $ST_{n-2}$, a source thereof is connected with Vf (i.e., a high-level signal), and a drain thereof is connected with Q.

According to the present embodiment, two download transistors T21 and T22 are arranged and connected with $G_n$ and $ST_n$ respectively. A gate of T21 is connected with Q, a source thereof is connected with a clock signal line, and a drain thereof is connected with $G_n$. A gate of T22 is connected with Q, a source thereof is connected with the clock signal line, and a drain thereof is connected with $ST_n$.

It can be seen that, the usage of T21 is the same as that of T22, and the signal output by $G_n$ is the same as that of $ST_n$. A gate driving signal output by $G_n$ is used for driving a TFT in a display area, while a signal output by $ST_n$ is transmitted among multiple gate driving circuits that are cascade-connected together (reference can be made to FIG. 5). The functions of $ST_{n-2}$, $ST_{n+1}$, $ST_{n+1}$, and $ST_{n+2}$ in other gate driving circuits are the same as that of $ST_n$. In this manner, $G_n$ and $ST_n$, which both output the totally same signal, are separated from each other, whereby the interference between $G_n$ and $ST_n$ can be avoided, and thus the quality of a waveform of the gate driving signal output by $G_n$ can be guaranteed.

In the gate driving circuit according to the embodiment of the present disclosure, a first input end and a second input end of the pull-up circuit are connected with $ST_{n-1}$ and $ST_{n-2}$ respectively. When $ST_{n-2}$ outputs a high-level signal, the reference point Q (i.e., the gates of T21 and T22) is charged for a first time by the pull-up circuit; and when $ST_{n-1}$ outputs the high-level signal, the reference point Q is charged for a second time by the pull-up circuit.

The reference point Q can reach a higher electric potential since it is charged twice. When the clock signal line CK has the high-level signal, and the drains of T21 and T22 output the gate driving signal, an electric potential difference Vgs between the gate and the source of T21 and those of T22 can be improved significantly. In this case, an output impedance of T21 and that of T22 can be reduced, so that the waveform of the gate driving signal that is output to $G_n$ and $ST_n$ can be optimized, and thus the display effect of the display device can be improved.

According to the present embodiment, the gate driving circuit is further provided with a coupling capacitor C, which is connected between Q and $ST_n$. When Q is charged by the pull-up circuit, a certain electric potential difference between two ends of the coupling capacitor C can be maintained. When $ST_n$ outputs the high-level signal, the electric potential of Q can be further improved due to a coupling effect of the coupling capacitor C. In this case, the electric potential difference Vgs between the gate and the source of T21 and those of T22 can be improved significantly, the output impedance of T21 and that of T22 can be reduced, so that the waveform of the gate driving signal that is output to $G_n$ and $ST_n$ can be optimized, and thus the display effect of the display device can be improved.

According to the present embodiment, the pull-down circuit comprises a first input end and a second input end. The first input end of the pull-down circuit is connected with $ST_{n+1}$, the second input end thereof is connected with an $(n+2)^{th}$ scanning line $ST_{n+2}$, and an output end thereof is connected with Q. Specifically, the pull-down circuit comprises a third transistor T3 and a fourth transistor T4. A gate of T3 is connected with $ST_{n+1}$, a source thereof is connected with a second signal line Vr, and a drain thereof is connected with Q. A gate of T4 is connected with $ST_{n+2}$, a source thereof is connected with Vr (i.e., the low-level signal), and a drain thereof is connected with Q. When $ST_{n+1}$ outputs the high-level signal, the electric potential of Q is pulled down for a first time by the pull-down circuit; and when $ST_{n+2}$ outputs the high-level signal, the electric potential of Q is pulled down for a second time by the pull-down circuit. Therefore, the electric potential of Q is pulled down twice, so that Q and $G_n$ can be maintained in a low electric potential, and thus signal fluctuation and interference of $G_n$ can be avoided.

In the gate driving circuit according to the embodiment of the present disclosure, two scanning modes, i.e., forward scanning and backward scanning, can be realized.

In addition, the gate driving circuit according to the present embodiment is further provided with a first pull-down sustaining circuit and a second pull-down sustaining circuit, wherein the first pull-down sustaining circuit is used for, during a forward scanning stage, sustaining the low-level signal of Q, $G_n$, and $ST_n$ after $G_n$ outputs the gate driving signal, and the second pull-down sustaining circuit is used for, during a backward scanning stage, sustaining the low-level signal of Q, $G_n$, and $ST_n$ after $G_n$ outputs the gate driving signal.

As shown in FIG. 2, the first pull-down sustaining circuit mainly comprises a low-level signal line Vss and transistors T51, T54, T43, T33, T36, T56, T52, etc, and the second pull-down sustaining circuit mainly comprises Vss and transistors T61, T64, T42, T32, T35, T66, T62, etc. The signal output by a signal line LC1 is the same as that of Vf, and the signal output by a signal line LC2 is the same as that of Vr.

Figure 3:
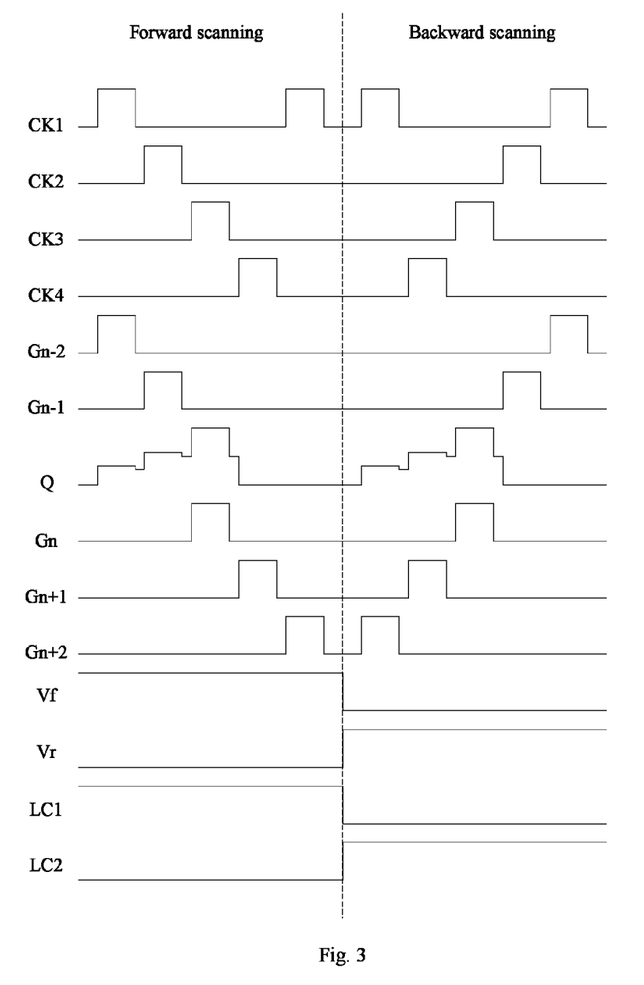
FIG. 3 schematically shows a waveform of the gate driving circuit according to the embodiment of the present disclosure.

During the forward scanning stage, Vf and LC1 both output the high-level signal, while Vr and LC2 both output the low-level signal, the waveforms thereof being shown in FIG. 3.

During a first scanning cycle, $ST_{n-2}$ outputs the high-level signal, T2 is turned on, and Q is charged by Vf through T2. Meanwhile, T51 and T56 are both turned on, and an electric potential of K is pulled down. Since Q has the high-level signal after being charged, T52 and T62 are both turned on, so that electric potentials of P and K are pulled down. T32, T33, T35, T36, T42, and T43 are all turned off. In addition, although T22 and T21 are both turned on, $G_n$ and $ST_n$ both have the low-level signal since CK (corresponding to CK3 in FIG. 3) outputs the low-level signal at this time.

During a second scanning cycle, $ST_{n-1}$ outputs the high-level signal, T1 is turned on, and Q is further charged by Vf through T1. At the same time, T64 is turned on, and the electric potential of P is released to a level the same as that of LC2 and maintained in a low-level state. T32, T33, T35, T36, T42, and T43 are all maintained in the turned-off state. In addition, CK continues to output the low-level signal, and $G_n$, as well as $ST_n$, are both maintained in the low-level state.

During a third scanning cycle, $ST_{n-1}$ and $ST_{n-2}$ both have the low-level signal, and T2 as well as T1 are both turned off. Q is still maintained in the high-level state, so that T22 and T21 are both turned on. Meanwhile, CK outputs the high-level signal, so that $G_n$, outputs the gate driving signal and $ST_n$ outputs the high-level signal as well. In addition, the electric potential of Q is further improved due to the coupling effect of C, and the Vgs of T22 as well as that of T21 can be further improved. Moreover, the value of Vgs can be maintained basically stable, so that the gate driving signal can be output smoothly. At the same time, T52 and T62 are maintained in the turned-on state, so that the electric potentials of P and K are pulled down, and T32, T33, T35, T36, T42, and T43 are all maintained in the turned-off state.

During a fourth scanning cycle, CK outputs the low-level signal, while $ST_{n+1}$ outputs the high-level signal, so that T3 is turned on, and the electric potential of Q is pulled down. At the same time, T54 is turned on, so that K is charged at the fastest speed. In this case, T36, T33, and T43 are all turned on instantaneously, so that the electric potentials of $G_n$, $ST_n$, and Q are all pulled down, and thus T22 as well as T21 are both turned off.

During a fifth scanning cycle, $ST_{+2}$ outputs the high-level signal, T4 is turned on, and the electric potential of Q is further pulled down. K is sustained in the high-level state in the residual time of this frame since LC1 of the first pull-down sustaining circuit continues to output the high-level signal to K through T51. In this case, T36, T33, and T43 are all maintained in the turned-on state, so that $G_n$, $ST_n$, and Q are all maintained in the low-level state.

During the backward scanning stage, Vf and LC1 both output the low-level signal, while Vr and LC2 both output the high-level signal, the waveforms thereof being shown in FIG. 3.

During a first scanning cycle, $ST_{n+2}$ outputs the high-level signal, T4 is turned on, and Q is charged by Vr through T4. Meanwhile, T61 and T66 are both turned on, and an electric potential of P is pulled down. Since Q has the high-level signal after being charged, T52 and T62 are both turned on, so that electric potentials of K and P are pulled down. T32, T33, T35, T36, T42, and T43 are all turned off. In addition, although T22 and T21 are both turned on, $G_n$ and $ST_n$ both have the low-level signal since CK (corresponding to CK3 in FIG. 3) outputs the low-level signal at this time.

During a second scanning cycle, $ST_{n+1}$ outputs the high-level signal, T3 is turned on, and Q is further charged by Vr through T3. At the same time, T54 is turned on, and the electric potential of K is released to a level the same as that of LC1 and maintained in a low-level state. T32, T33, T35, T36, T42, and T43 are all maintained in the turned-off state. In addition, CK continues to output the low-level signal, and $G_n$ as well as $ST_n$ are both maintained in the low-level state.

During a third scanning cycle, $ST_{n+1}$ and $ST_{n+2}$ both have the low-level signal, and T3 as well as T4 are both turned off. Q is still maintained in the high-level state, so that T22 and T21 are both turned on. Meanwhile, CK outputs the high-level signal, so that $G_n$ outputs the gate driving signal and $ST_n$ outputs the high-level signal as well. In addition, the electric potential of Q is further improved due to the coupling effect of C, and the Vgs of T22 as well as that of T21 can be further improved. Moreover, the value of Vgs can be maintained basically stable, so that the gate driving signal can be output smoothly. At the same time, T52 and T62 are maintained in the turned-on state, so that the electric potentials of P and K are pulled down, and T32, T33, T35, T36, T42, and T43 are all maintained in the turned-off state.

During a fourth scanning cycle, CK outputs the low-level signal, while $ST_{n-1}$ outputs the high-level signal, so that T1 is turned on, and the electric potential of Q is pulled down. At the same time, T64 is turned on, so that P is charged at the fastest speed. In this case, T35, T32, and T42 are all turned on instantaneously, so that the electric potentials of $G_n$, $ST_n$, and Q are all pulled down, and thus T22 as well as T21 are both turned off.

During a fifth scanning cycle, $ST_{n-2}$ outputs the high-level signal, T2 is turned on, and the electric potential of Q is further pulled down. P is sustained in the high-level state in the residual time of this frame since LC2 of the second pull-down sustaining circuit continues to output the high-level signal to P through T61. In this case, T35, T32, and T42 are all maintained in the turned-on state, so that $G_n$, $ST_n$, and Q are all maintained in the low-level state.

The display effect during the forward scanning stage would be different from that during the backward scanning stage since the loads of the components are different from one another. According to the embodiment of the present disclosure, the gate driving circuits can be cascade-connected, whereby two scanning modes, i.e., forward scanning and backward scanning, can be realized. Thus an optimal display effect can be achieved.

Embodiment 2

Figure 4:
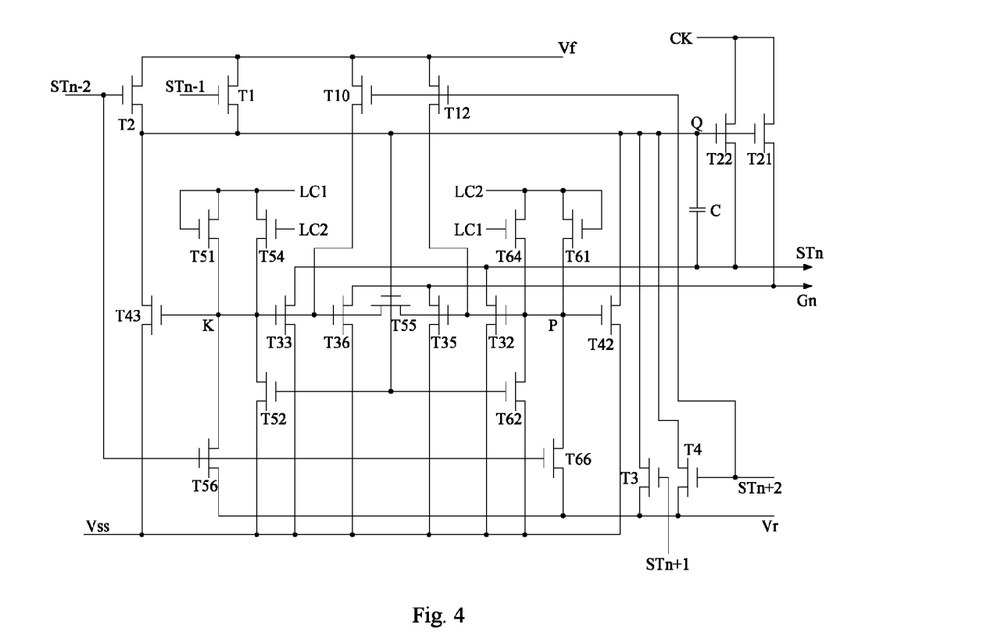
FIG. 4 is a circuit diagram of a gate driving circuit according to Embodiment 2 of the present disclosure.

As shown in FIG. 4, the present embodiment is basically the same as Embodiment 1 except the following differences. Improved on the basis of Embodiment 1, in Embodiment 2, transistor T56 is connected between K and Vr, T66 is connected between P and Vr, and the gate of T66 is connected with $ST_{n-2}$. In addition, transistors T10 and T12 are added, wherein T10 is connected between K and Vf, T12 is connected between P and Vf, and the gates of T10 and T12 are both connected with $ST_{n+2}$. T55 is connected between P and K, and the gate of T55 is connected with Q. In the first pull-down sustaining circuit, the gate of T54 is connected with LC2; and in the second pull-down sustaining circuit, the gate of T64 is connected with LC1.

During the forward scanning stage, Vf and LC1 both output the high-level signal, while Vr and LC2 both output the low-level signal, the waveforms thereof being shown in FIG. 3. In the second pull-down sustaining circuit, T64 is always turned on, so that P is always maintained in the low-level state.

During a first scanning cycle, $ST_{n-2}$ outputs the high-level signal, T2 is turned on, and Q is charged by Vf through T2. Meanwhile, T66 and T56 are both turned on, and the electric potentials of K and P are pulled down. Since Q has the high-level signal after being charged, T52 and T62 are both turned on, so that the electric potentials of P and K are further pulled down. T32, T33, T35, T36, T42, and T43 are all turned off T55 is turned on after Q is charged, so that K and P are connected and maintained in the low-level state. In addition, although T22 and T21 are both turned on, $G_n$ and $ST_n$ both have the low-level signal since CK (corresponding to CK3 in FIG. 3) outputs the low-level signal at this time.

During a second scanning cycle, $ST_{n-1}$ outputs the high-level signal, T1 is turned on, and Q is further charged by Vf through T1. T32, T33, T35, T36, T42, and T43 are all maintained in the turned-off state. In addition, CK continues to output the low-level signal, and $G_n$, as well as $ST_n$ are both maintained in the low-level state.

During a third scanning cycle, $ST_{n-1}$ and $ST_{n-2}$ both have the low-level signal, and T2 as well as T1 are both turned off. Q is still maintained in the high-level state, so that T22 and T21 are both turned on. Meanwhile, CK outputs the high-level signal, so that $G_n$ outputs the gate driving signal and $ST_n$ outputs the high-level signal as well. In addition, the electric potential of Q is further improved due to the coupling effect of C, and the Vgs of T22 as well as that of T21 can be further improved. Moreover, the value of Vgs can be maintained basically stable, so that the gate driving signal can be output smoothly. At the same time, T52 and T62 are maintained in the turned-on state, so that the electric potentials of P and K are pulled down, and T32, T33, T35, T36, T42, and T43 are all maintained in the turned-off state.

During a fourth scanning cycle, CK outputs the low-level signal, while $ST_{n+1}$ outputs the high-level signal, so that T3 is turned on, and the electric potential of Q is pulled down by Vr. Hence, T55 is turned off, and P and K are disconnected. At the same time, T52 and T62 are both turned off, and LC1 outputs the high-level signal to K through T51. In this case, T36, T33, and T43 are all turned on, so that the electric potentials of $G_n$, $ST_n$, and Q are all pulled down, and thus T22 as well as T21 are both turned off.

During a fifth scanning cycle, $ST_{n+2}$ outputs the high-level signal, T4 and T10 are both turned on, and the electric potential of Q is further pulled down. Vf continues to output the high-level signal to K through T10. K is sustained in the high-level state in the residual time of this frame since LC1 of the first pull-down sustaining circuit continues to output the high-level signal to K through T51. In this case, T36, T33, and T43 are all maintained in the turned-on state, so that $G_n$, $ST_n$, and Q are all maintained in the low-level state.

During the backward scanning stage, Vf and LC1 both output the low-level signal, while Vr and LC2 both output the high-level signal, the waveforms thereof being shown in FIG. 3. In the first pull-down sustaining circuit, T54 is always turned on, so that K is always maintained in the low-level state.

During a first scanning cycle, $ST_{n+2}$ outputs the high-level signal, T4 is turned on, and Q is charged by Vr through T4. Meanwhile, T10 and T12 are both turned on, and the electric potentials of K and P are pulled down. Since Q has the high-level signal after being charged, T52 and T62 are both turned on, so that the electric potentials of P and K are further pulled down. T32, T33, T35, T36, T42, and T43 are all turned off T55 is turned on after Q is charged, so that K and P are connected and maintained in the low-level state. In addition, although T22 and T21 are both turned on, $G_n$ and $ST_n$ both have the low-level signal since CK (corresponding to CK3 in FIG. 3) outputs the low-level signal at this time.

During a second scanning cycle, $ST_{n-2}$ outputs the high-level signal, T3 is turned on, and Q is further charged by Vr through T3. T32, T33, T35, T36, T42, and T43 are all maintained in the turned-off state. In addition, CK continues to output the low-level signal, and $G_n$ as well as $ST_n$ are both maintained in the low-level state.

During a third scanning cycle, $ST_{n+1}$ and $ST_{+2}$ both have the low-level signal, and T3 as well as T4 are both turned off. Q is still maintained in the high-level state, so that T22 and T21 are both turned on. Meanwhile, CK outputs the high-level signal, so that $G_n$ outputs the gate driving signal and $ST_n$, outputs the high-level signal as well. In addition, the electric potential of Q is further improved due to the coupling effect of C, and the Vgs of T22 as well as that of T21 can be further improved. Moreover, the value of Vgs can be maintained basically stable, so that the gate driving signal can be output smoothly. At the same time, T52 and T62 are maintained in the turned-on state, so that the electric potentials of P and K are pulled down, and T32, T33, T35, T36, T42, and T43 are all maintained in the turned-off state.

During a fourth scanning cycle, CK outputs the low-level signal, while $ST_{n-1}$ outputs the high-level signal, so that T1 is turned on, and the electric potential of Q is pulled down by Vf. Hence, T55 is turned off, and P and K are disconnected. At the same time, T52 and T62 are both turned off, and LC2 outputs the high-level signal to P through T61. In this case, T35, T32, and T42 are all turned on, so that the electric potentials of $G_n$, $ST_n$, and Q are all pulled down, and thus T22 as well as T21 are both turned off.

During a fifth scanning cycle, $ST_{n-2}$ outputs the high-level signal, T2 and T66 are both turned on, and the electric potential of Q is further pulled down. Vf continues to output the high-level signal to P through T66. P is sustained in the high-level state in the residual time of this frame since LC2 of the second pull-down sustaining circuit continues to output the high-level signal to P through T61. In this case, T35, T32, and T42 are all maintained in the turned-on state, so that $G_n$, $ST_n$, and Q are all maintained in the low-level state.

According to the present embodiment, the electric potentials of K and P can be controlled more accurately compared with Embodiment 1, whereby the quality of the waveform of the gate driving signal can be further improved. In addition, according to the present embodiment, the switching between forward scanning and backward scanning becomes more flexible, which can be performed after each frame or a plurality of frames.

Embodiment 3

Figure 5:
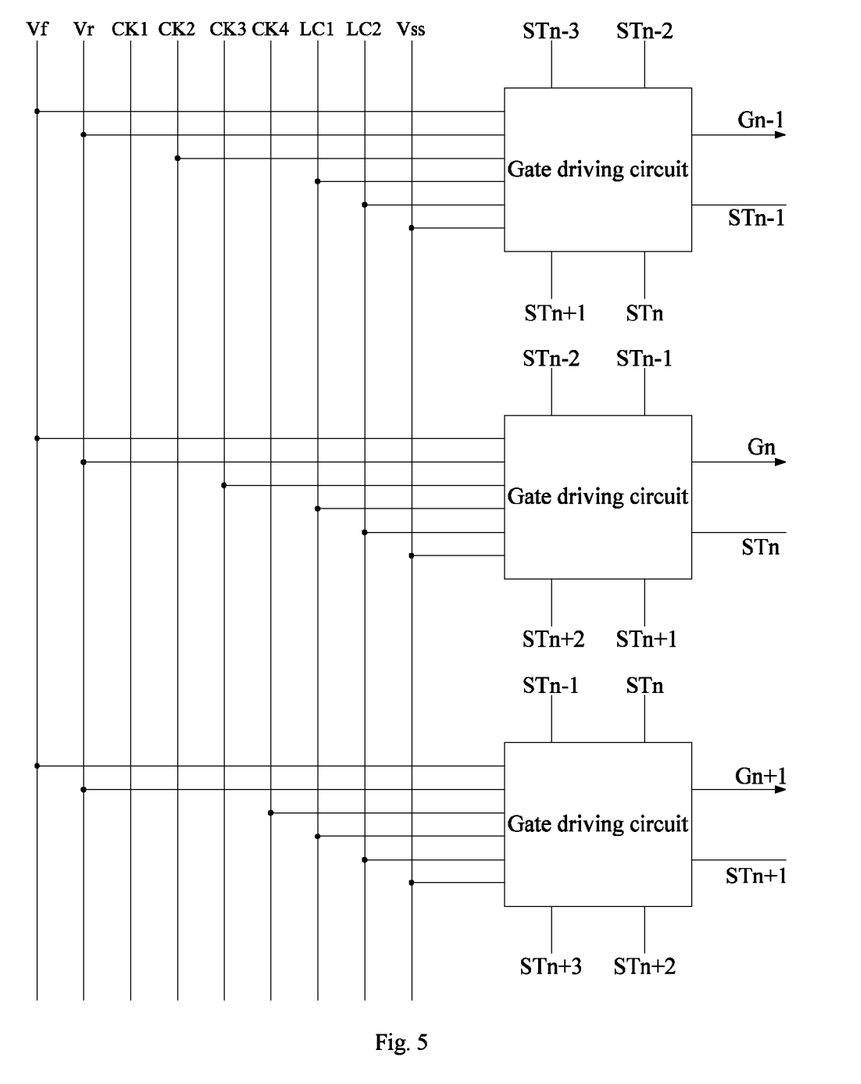
FIG. 5 schematically shows the gate driving circuits that are cascade-connected in an array substrate according to Embodiment 3 of the present disclosure.

The embodiment of the present disclosure provides an array substrate, which is manufactured through GOA technology. The array substrate is provided with a plurality of gate driving circuits according to Embodiment 1 or Embodiment 2, and the gate driving circuits are cascade-connected. As shown in FIG. 5, each gate driving circuit is used for outputting a gate driving signal to a scanning line.

Further, in four adjacent gate driving circuits, the sources of the download transistors thereof are connected with four clock signal lines CK1, CK2, CK3, and CK4 respectively, and the four clock signal lines output high-level signals in sequence (as shown in FIG. 3). In this case, each scanning line outputs the gate driving signal in sequence, and two scanning modes, i.e., forward scanning and backward scanning, can be realized.

The embodiment of the present disclosure further provides a display device. The display device can be liquid crystal display device with narrow frame, which comprises a color filter substrate and the array substrate provided by the present embodiment.

The display device provided by the present embodiment can be OLED display device comprising the above array substrate. The display products with narrow frame or even without frame can be produced through GOA technology.

The array substrate and display device provided by the present embodiment have the same technical feature with the gate driving circuit provided by Embodiment 1 and Embodiment 2. Therefore, they can solve the same technical problem and achieve the same technical effect.

The above embodiments are described only for better understanding, rather than restricting, the present disclosure. Any person skilled in the art can make amendments to the implementing forms or details without departing from the spirit and scope of the present disclosure. The protection scope of the present disclosure shall be determined by the scope as defined in the claims.

The invention claimed is:

1. A gate driving circuit, used for outputting a gate driving signal to an $n^{th}$ scanning line, said gate driving circuit comprising a pull-up circuit, a download transistor, and a pull-down circuit,
   wherein said pull-up circuit is used for outputting a high-level signal to a reference point of said gate driving circuit, said pull-up circuit having a first input end connected with an $(n-1)^{th}$ scanning line, a second input end connected with an $(n-2)^{th}$ scanning line, and an output end connected with said reference point;
   wherein said download transistor has a gate connected with said reference point, a source connected with a clock signal line, and a drain connected with the $n^{th}$ scanning line, the drain of said download transistor outputting the high-level signal to the $n^{th}$ scanning line when said reference point and said clock signal line both have the high-level signal; and
   wherein said pull-down circuit is used for outputting a low-level signal to said reference point and the $n^{th}$ scanning line, said pull-down circuit having a first input end connected with an $(n+1)^{th}$ scanning line, and an output end connected with said reference point;
   wherein said pull-up circuit comprises a first transistor and a second transistor;
   wherein a gate of said first transistor is connected with the $(n-1)^{th}$ scanning line, a source thereof is connected with a first signal line, and a drain thereof is connected with said reference point; and
   wherein a gate of said second transistor is connected with the $(n-2)^{th}$ scanning line, a source thereof is connected with the first signal line, and a drain thereof is connected with said reference point.

2. The gate driving circuit according to claim 1, further comprising a coupling capacitor that is connected between said reference point and the $n^{th}$ scanning line.

3. The gate driving circuit according to claim 1, wherein said pull-down circuit is provided with a second input end that is connected with an $(n+2)^{th}$ scanning line.

4. The gate driving circuit according to claim 3, wherein said pull-down circuit comprises a third transistor and a fourth transistor;
   wherein a gate of said third transistor is connected with the $(n+1)^{th}$ scanning line, a source thereof is connected with a second signal line, and a drain thereof is connected with said reference point; and
   wherein a gate of said fourth transistor is connected with the $(n+2)^{th}$ scanning line, a source thereof is connected with the second signal line, and a drain thereof is connected with said reference point.

5. The gate driving circuit according to claim 4, wherein during a forward scanning stage, said first signal line outputs a high-level signal, and said second signal line outputs a low-level signal; and wherein during a backward scanning stage, said first signal line outputs a low-level signal, and said second signal line outputs a high-level signal.

6. The gate driving circuit according to claim 5, further comprising a first pull-down sustaining circuit and a second pull-down sustaining circuit, wherein during a forward scanning stage, said first pull-down sustaining circuit is used for sustaining the low-level signal of said reference point and the $n^{th}$ scanning line; and wherein during a backward scanning stage, said second pull-down sustaining circuit is used for sustaining the low-level signal of said reference point and the $n^{th}$ scanning line.

7. An array substrate, comprising a plurality of gate driving circuits that are cascade-connected, each of said gate driving circuits being used for outputting a gate driving signal to a scanning line, wherein an $n^{th}$ gate driving circuit is used for outputting a gate driving signal to an $n^{th}$ scanning line;

wherein said $n^{th}$ gate driving circuit comprises a pull-up circuit, a download transistor, and a pull-down circuit;

wherein said pull-up circuit is used for outputting a high-level signal to a reference point of said $n^{th}$ gate driving circuit, said pull-up circuit having a first input end connected with an $(n-1)^{th}$ scanning line, a second input end connected with an $(n-2)^{th}$ scanning line, and an output end connected with said reference point;

wherein said download transistor has a gate connected with said reference point, a source connected with a clock signal line, and a drain connected with the $n^{th}$ scanning line, the drain of said download transistor outputting the high-level signal to the $n^{th}$ scanning line when said reference point and said clock signal line both have the high-level signal; and wherein said pull-down circuit is used for outputting a low-level signal to said reference point and the $n^{th}$ scanning line, said pull-down circuit having a first input end connected with an $(n+1)^{th}$ scanning line, and an output end connected with said reference point;

wherein said pull-up circuit comprises a first transistor and a second transistor;

wherein a gate of said first transistor is connected with the $(n-1)^{th}$ scanning line, a source thereof is connected with a first signal line, and a drain thereof is connected with said reference point; and wherein a gate of said second transistor is connected with the $(n-2)^{th}$ scanning line, a source thereof is connected with the first signal line, and a drain thereof is connected with said reference point.

8. The array substrate according to claim 7, wherein the $n^{th}$ gate driving circuit further comprises a coupling capacitor that is connected between said reference point and the $n^{th}$ scanning line.

9. The array substrate according to claim 8, wherein said pull-down circuit is provided with a second input end that is connected with an $(n+2)^{th}$ scanning line.

10. The array substrate according to claim 9, wherein said pull-down circuit comprises a third transistor and a fourth transistor;

wherein a gate of said third transistor is connected with the $(n+1)^{th}$ scanning line, a source thereof is connected with a second signal line, and a drain thereof is connected with said reference point; and wherein a gate of said fourth transistor is connected with the $(n+2)^{th}$ scanning line, a source thereof is connected with the second signal line, and a drain thereof is connected with said reference point.

11. The array substrate according to claim 10, wherein during a forward scanning stage, said first signal line outputs a high-level signal, and said second signal line outputs a low-level signal; and wherein during a backward scanning stage, said first signal line outputs a low-level signal, and said second signal line outputs a high-level signal.

12. The array substrate according to claim 11, further comprising a first pull-down sustaining circuit and a second pull-down sustaining circuit, wherein during a forward scanning stage, said first pull-down sustaining circuit is used for sustaining the low-level signal of said reference point and the $n^{th}$ scanning line; and wherein during a backward scanning stage, said second pull-down sustaining circuit is used for sustaining the low-level signal of said reference point and the $n^{th}$ scanning line.

13. The array substrate according to claim 7, wherein in four adjacent gate driving circuits, the sources of the download transistors thereof are connected with four clock signal lines respectively, and the four clock signal lines output high-level signals in sequence.

14. A display device, comprising an array substrate, wherein said array substrate comprises a plurality of gate driving circuits that are cascade-connected, each of said gate driving circuits being used for outputting a gate driving signal to a scanning line;

wherein an $n^{th}$ gate driving circuit is used for outputting a gate driving signal to an $n^{th}$ scanning line;

wherein said $n^{th}$ gate driving circuit comprises a pull-up circuit, a download transistor, and a pull-down circuit;

wherein said pull-up circuit is used for outputting a high-level signal to a reference point of said gate driving circuit, said pull-up circuit having a first input end connected with an $(n-1)^{th}$ scanning line, a second input end connected with an $(n-2)^{th}$ scanning line, and an output end connected with said reference point;

wherein said download transistor has a gate connected with said reference point, a source connected with a clock signal line, and a drain connected with the $n^{th}$ scanning line, the drain of said download transistor outputting the high-level signal to the $n^{th}$ scanning line when said reference point and said clock signal line both have the high-level signal;

wherein said pull-down circuit is used for outputting a low-level signal to said reference point and the $n^{th}$ scanning line, said pull-down circuit having a first input end connected with an $(n+1)^{th}$ scanning line, and an output end connected with said reference point;

wherein said pull-up circuit comprises a first transistor and a second transistor;

wherein a gate of said first transistor is connected with the $(n-1)^{th}$ scanning line, a source thereof is connected with a first signal line, and a drain thereof is connected with said reference point; and wherein a gate of said second transistor is connected with the $(n-2)^{th}$ scanning line, a source thereof is connected with the first signal line, and a drain thereof is connected with said reference point.

* * * * *